(12) United States Patent
Chih

(10) Patent No.: US 9,390,799 B2
(45) Date of Patent: Jul. 12, 2016

(54) NON-VOLATILE MEMORY CELL DEVICES AND METHODS, HAVING A STORAGE CELL WITH TWO SIDEWALL BIT CELLS

(75) Inventor: Yue-Der Chih, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 554 days.

(21) Appl. No.: 13/460,487

(22) Filed: Apr. 30, 2012

(65) Prior Publication Data
US 2013/0286729 A1 Oct. 31, 2013

(51) Int. Cl.
*G11C 16/04* (2006.01)
*G11C 11/56* (2006.01)
*H01L 29/70* (2006.01)
*H01L 29/40* (2006.01)
*H01L 29/423* (2006.01)
*H01L 29/792* (2006.01)

(52) U.S. Cl.
CPC ........ *G11C 16/0458* (2013.01); *G11C 11/5621* (2013.01); *H01L 29/42348* (2013.01); *H01L 29/7923* (2013.01)

(58) Field of Classification Search
CPC ........... G11C 16/0458; G11C 11/5621; H01L 29/42348; H01L 29/7923
USPC .................. 365/181, 185.03, 185.05, 185.16, 365/185.18, 185.21, 185.24
See application file for complete search history.

(56) References Cited

U.S. PATENT DOCUMENTS

| | | | | |
|---|---|---|---|---|
| 5,021,999 A * | 6/1991 | Kohda et al. | ............ | 365/185.03 |
| 5,615,159 A * | 3/1997 | Roohparvar | ............ | 365/185.07 |
| 5,714,412 A * | 2/1998 | Liang et al. | ............ | 438/266 |
| 5,760,435 A * | 6/1998 | Pan | ............ | 257/314 |
| 5,949,711 A * | 9/1999 | Kazerounian | ............ | 365/185.05 |
| 6,339,540 B1 * | 1/2002 | Lavi | ............ | G11C 11/5671 257/E21.21 |
| 6,620,683 B1 * | 9/2003 | Lin et al. | ............ | 438/257 |
| 7,808,818 B2 * | 10/2010 | Eitan | ............ | 365/185.03 |
| 2002/0051384 A1 * | 5/2002 | Cernea et al. | ............ | 365/185.21 |
| 2004/0257871 A1 * | 12/2004 | Swift et al. | ............ | 365/174 |
| 2004/0257878 A1 * | 12/2004 | Morikawa | ............ | G11C 16/0475 365/185.28 |
| 2004/0264270 A1 * | 12/2004 | Iwata | ............ | H01L 21/28282 365/200 |
| 2006/0244070 A1 * | 11/2006 | Iwata | ............ | H01L 21/28273 257/355 |
| 2007/0008775 A1 * | 1/2007 | Telecco et al. | ............ | 365/185.3 |
| 2007/0086238 A1 * | 4/2007 | Ohta | ............ | 365/185.2 |
| 2008/0037329 A1 * | 2/2008 | Takahashi | ............ | G11C 16/0475 365/185.21 |
| 2008/0089146 A1 * | 4/2008 | Fujito et al. | ............ | 365/190 |
| 2010/0020603 A1 * | 1/2010 | Yuda | ............ | 365/185.03 |
| 2010/0046302 A1 * | 2/2010 | Ogura et al. | ............ | 365/185.21 |

OTHER PUBLICATIONS

Shukuri, S. et al., "A 10k-Cycling Reliable 90nm Logic NVM 'eCFlash' (embedded CMOS Flash) Technology," IEEE, 2011, 2 pages.

* cited by examiner

*Primary Examiner* — J. H. Hur
(74) *Attorney, Agent, or Firm* — Slater Matsil, LLP

(57) ABSTRACT

Non-volatile memory cells and methods. In an apparatus, an array of non-volatile storage cells formed in a portion of a semiconductor substrate includes a first storage cell having a first bit cell and a second bit cell; a second storage cell having a third bit cell and a fourth bit cell; and a column multiplexer coupled to a plurality of column lines, selected ones of the column lines coupled to a first source/drain terminal of the first and the second storage cell and coupled to a second source/drain terminal of the first and second storage cell, the column multiplexer coupling a voltage to one of the column lines connected to the first storage cell corresponding to the data, and coupling a voltage to one of the column lines connected to the second storage cell corresponding to the complementary data.

20 Claims, 10 Drawing Sheets

NON-VOLATILE MEMORY CELL DEVICES AND METHODS, HAVING A STORAGE CELL WITH TWO SIDEWALL BIT CELLS

TECHNICAL FIELD

The present invention relates to a non-volatile memory cell structure and methods for providing the non-volatile memory cell structure for embedding with logic circuitry and compatible with advanced semiconductor manufacturing processes.

BACKGROUND

A current common requirement for an electronic circuit and particularly for electronic circuits manufactured as integrated circuits in semiconductor processes is an array of memory storage elements. These elements may be provided as non-volatile memory (NVM) cells. In traditional NVM structures, FLASH memory may be used. However the use of FLASH memory requires semiconductor processing steps in addition to the advanced semiconductor processing used for logic circuitry, for example. The FLASH cells require expensive process steps. More recently, logic compatible NVM cells have been developed. Some of these logic compatible memory cells use a floating gate which is formed using the gate electrode materials and gate oxides of the logic processes. As the process nodes for semiconductor processes continue to scale to smaller feature sizes, the gate oxide thicknesses (Tox) also are reduced to a point where reliable floating gate cells may not be reliably produced. Leakage of current from the stored trapped charges may result in inoperable or unreliable storage cells; that is, the floating gate cells may experience errors due to leakage.

NVM cells using sidewall storage are in use. In these cells a charge trapping layer is provided in the sidewall dielectrics of a cell form that includes, for example, a MOS transistor such as PMOS or NMOS transistor. By using channel hot electrons (CHE) to "program" the cells, electrons may be trapped in a charge trapping dielectric on the sidewall. However, when a single sidewall storage area is used to store a bit of information, in a "one cell per bit" arrangement, reliable operation is difficult to obtain. Variations in the programmed and unprogrammed currents for the cells have been observed. These variations make reliable operation difficult.

In another known approach, these reliability problems are addressed by using two cells to store one bit of information, in a "two cells per bit" structure. These may be referred to as "2T" cells. In this approach, one cell stores the desired data, and the other cell stores the desired data in a complementary form, that is "bit" and "bit bar". By using two separate bit lines to read data from both of these cells during a read cycle, a self-referenced data value may be obtained by simply comparing the currents (or corresponding voltages) on the bit and bit bar bit lines. Since one of the two cells will be programmed and the other will be unprogrammed, the programmed and unprogrammed states representing a stored logic "0" and a stored logic "1", the two currents will differ and may be easily compared, and a very rapid read may be obtained.

However the use of two cells per bit effectively doubles the cell array size needed to store data. These cells are considered "2T" cells and require about twice the area per bit when compared to one cell per bit or "1T" arrangements (one transistor per bit). Improvements are needed in the reliability and the density of non-volatile memory storage cells that are logic process compatible; that is, non-volatile storage cells are needed that may be produced on an integrated circuit embedded with logic circuitry in an advanced semiconductor process, without the need for additional steps or expensive process steps.

BRIEF DESCRIPTION OF THE FIGURES

For a more complete understanding of the present invention, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific examples discussed are merely illustrative of specific ways to make and use the embodiments, and do not limit the scope of either the embodiments or of the appended claims.

Figure 1:
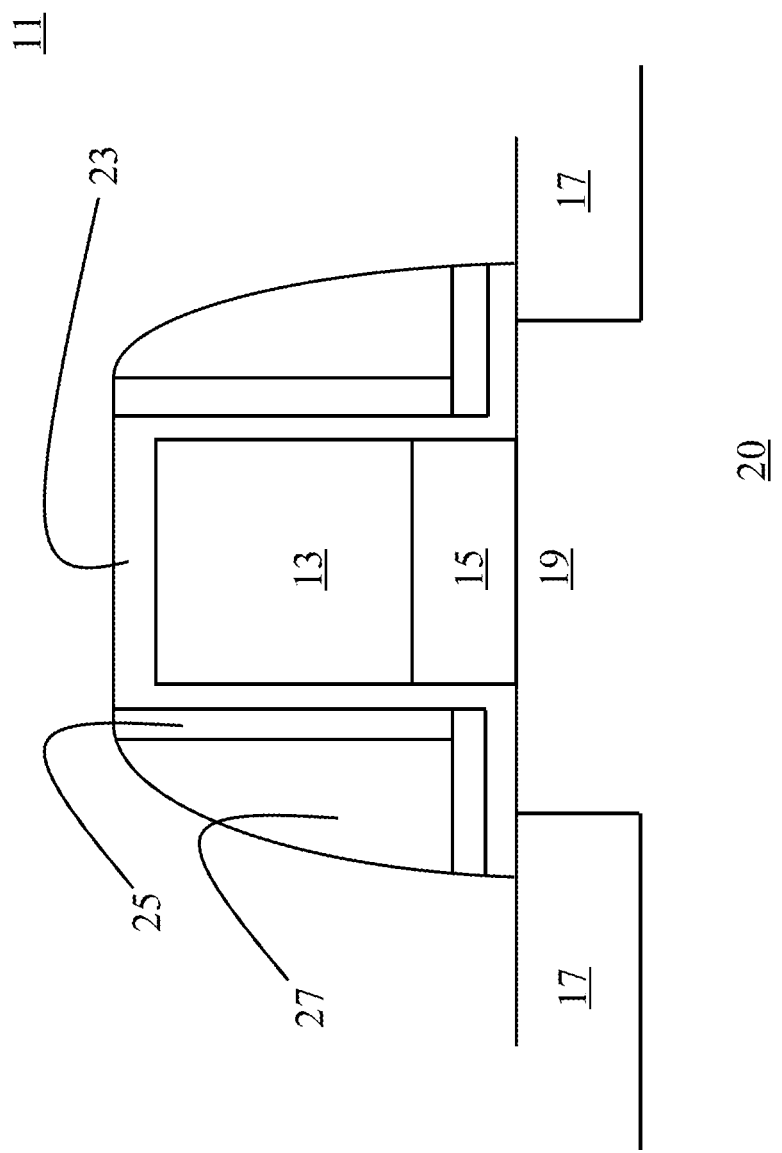
FIG. 1 illustrates an embodiment storage cell in a cross-sectional view.

FIG. 1 depicts as a non-limiting example, a cross-section of a typical MOS transistor type silicon-oxide-nitride-oxide-silicon (SONOS) cell 11. In this example the cell 11 uses sidewall storage regions. A gate electrode 13 is formed over a gate dielectric 15 which is formed over a semiconductor substrate 20. The semiconductor substrate may be formed of bulk silicon, gallium arsenide, germanium, silicon germanium or other semiconductor materials used for integrated circuits. Source/drain regions 17 are shown on either side of a channel region 19 in the substrate 20. The source/drain regions 17 are typically formed by ion implantation of dopant materials and may be further formed by the use of thermal diffusion. These source/drain regions 17 may be self-aligned using the gate structure or spacers on the gate structure. Dummy spacers may be used to align the implants. On either side of the gate electrode 13 and gate dielectric 15, sidewalls may be formed of a first dielectric layer 23, a second dielectric layer 25, and a final dielectric layer 27. These layers are usually formed of different dielectric materials to allow for selective etch processes to shape the materials. In one example, first dielectric layer 23 may be an oxide such as SiO2 which may be formed as TEOS, SOG, or otherwise. A nitride layer such as silicon nitride 25 is then formed. This may be by a CVD process. A final oxide layer 27 is formed to complete the sidewalls, which are now ONO layers. As is known, a nitride layer surrounded by oxide (O—N—O) can be used as a charge trapping layer, and may store charge. The sidewalls of the MOS transistor in the cell 11 may therefore store charge that changes the operation of the cell 11 and this stored charge may correspond to data bits. Because the source and drain regions are physically symmetrical, the cell 11 may be operated with source/drain and gate voltages that cause one source/drain region to act as a "source" region, and the other to act as a "drain" region, and by reversing the voltages and operations, the cell can be flipped to cause the first source/drain region to be the "drain", and the second to be the "source"; in this manner both of the sidewall storage regions may be programmed, read and erased in independent operations.

Although the MOS transistor storage cell 11 is shown formed as a planar MOS transistor, other types of transistor storage cells may be used, such as finFET transistors. Also, the semiconductor substrate 20 could be implemented using a layer of semiconductor material grown on an insulator, such as a silicon epitaxial layer or silicon germanium epitaxial layer. Thus the storage cells 11 could be arranged in vertical layers above the substrate. These arrangements form alternative embodiments to the planar transistor example shown here.

Figure 2:
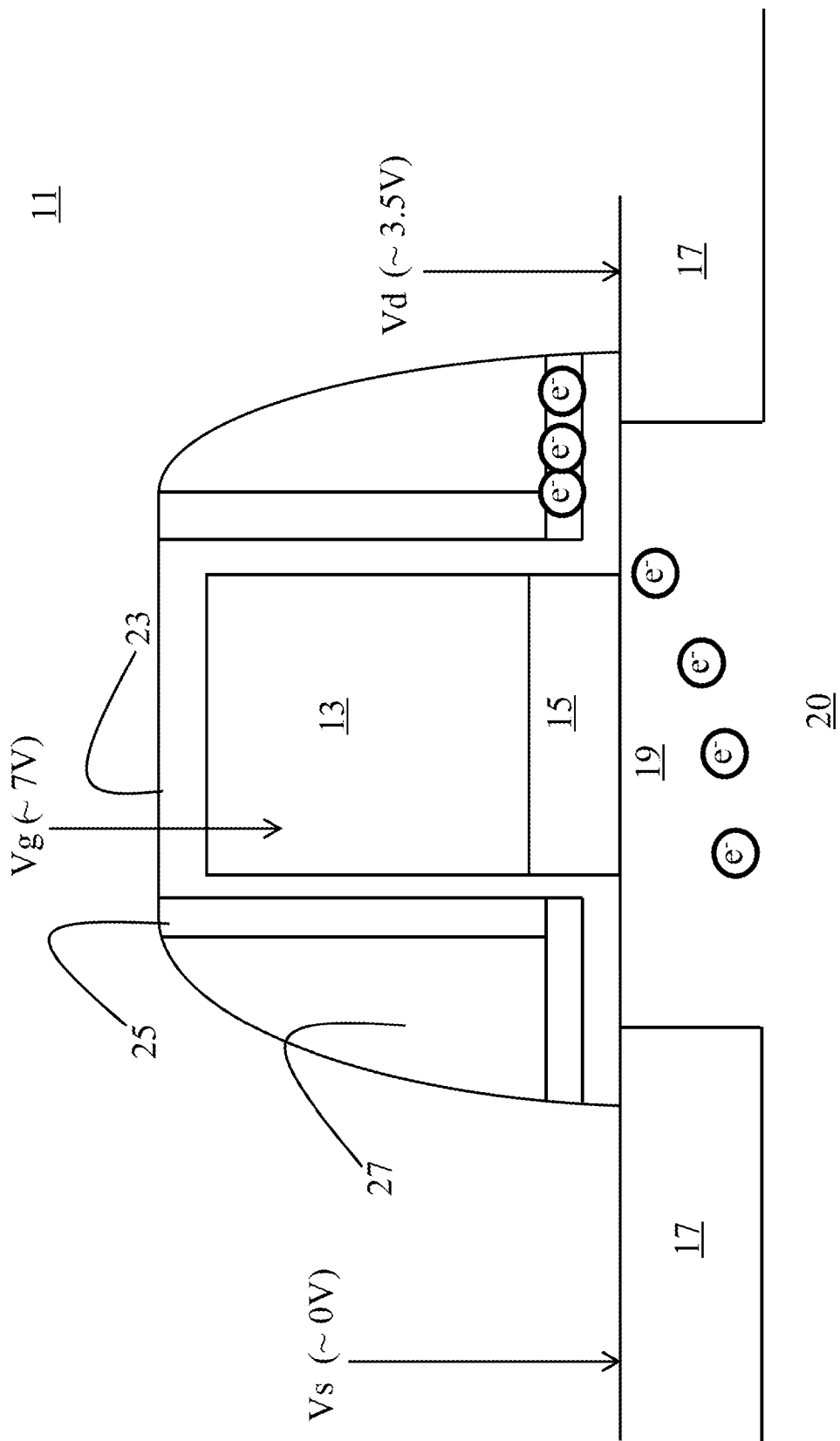
FIG. 2 illustrates the embodiment of FIG. 1 in cross section and illustrates a programming operation.

FIG. 2 depicts the storage cell 11 of FIG. 1 in a programming operation. The reference numerals from FIG. 1 are used again for like elements. In FIG. 2, channel hot electron (CHE) programming is illustrated, shown by the electrons drawn in the channel region and stored in the sidewall of the cell 11 of FIG. 2. In CHE programming, a low or ground voltage is placed on the "source" of the storage cell transistor. A programming voltage is placed on the gate, for example, this might be a relatively high voltage such as 7 volts. A voltage is placed on the "drain" region which attracts electrons from the source. In one example, this voltage may be about 3.5 volts, although higher and lower voltages may be used. As the electrons traverse the channel, the potentials on the gate and drain are sufficiently strong to cause some electrons, called "hot" electrons, to "jump" the thin oxide layer 23 into the nitride layer 25 of the sidewall storage area that is adjacent the drain region. These channel hot electrons become trapped and change the threshold voltage (Vt) of the storage cell 11. By increasing the threshold voltage Vt, the bit cell formed in the sidewall region is programmed in an "off" state for a given read voltage placed on the gate. This programmed state may be considered a logic "0" state. (Alternatively, it could be considered a logic "1" state). Because the cell with a higher Vt will not conduct when a middle level read voltage Vg is received from a word line (not shown, but described below) at the gate, the cell stores a bit that corresponds to a logic "0".

As described above, by reversing the "source" and "drain" voltages, the cell 11 can be operated so as to store charges in bit cells on both sidewalls. In that case, each memory cell 11 can store two bits in two bit cells. However, in practical applications, the reliability of the read of the bits from a conventional "two bit per cell" memory array is reduced.

In contrast to the prior approaches, in the embodiments of the present application, the reliability is increased by storing a true data bit and also a complementary data bit. Further, in the embodiments, the true and complementary data bits are programmed at the same time during a write operation, and, stored in sidewall bit cells of two different memory cells. In an example embodiment, the write operation begins with an erase operation. Selected cells are erased into an erased state, that is, with a low threshold voltage for both the true and complementary storage nodes, for each bit to be stored. A program operation that completes the write operation. In the operation, one of the two storage nodes is programmed to have a high threshold voltage, while the other storage node remains at an erased state (with a low threshold voltage.) The node that is programmed is determined by the data being stored, that is, whether the true data is a "0" or a "1" logic value. Note that the choice of the high or low threshold voltage node being used to represent a stored logic "0" or logic "1" is somewhat arbitrary, and in alternative embodiments, the threshold voltages chosen for the logic levels may be reversed without difficulty. Inverter circuits may be added to provide the voltage level needed for a given logic value. In this manner, the two stored bits may also be read at the same time and simply compared, providing a "self-referencing" read operation. That is, no nominal reference voltage or reference current is needed for the read operation.

From a storage density point of view, in the embodiments, each bit and complementary bit is stored in "1/2T" cells, so that each stored datum requires only a "1T" cell for storage. The remaining half of each of the cells is then available for storing another bit, or its complementary bit. High density storage of "1T" density is thus obtained with reliable operation. Electrically, two cells are read during a read operation, so from an electrical point of view, the storage is "two cells per bit"; which increases reliability and performance.

To erase the storage cell 11, a band to band hot hole (BT-BHH) injection may be used. By providing a low, or even negative, voltage on the gate, and a high voltage at the drain regions, holes may be injected into the bit cells of the sidewall storage areas. These holes then form electron-hole pairs with any trapped electrons, thus erasing any stored charges. This erase operation lowers the threshold voltage Vt of the cell back to its erased state; and when a read voltage is placed on the gate, the transistor in the storage cell 11 will "turn on" and conduct from drain to source, and a current will flow. This corresponds to a logic "1" state. The cells may be erased on an array basis or a row-wide basis. Erasing multiple cells at once may be done for higher layout density (fewer connections needed) and to increase layout density, and to simplify the row and column line decoding and routing circuitry, as is done in a FLASH type memory device. There are many alternatives such as erasing by row, by column, by subarrays, etc., that form alternative embodiments.

Figure 3:
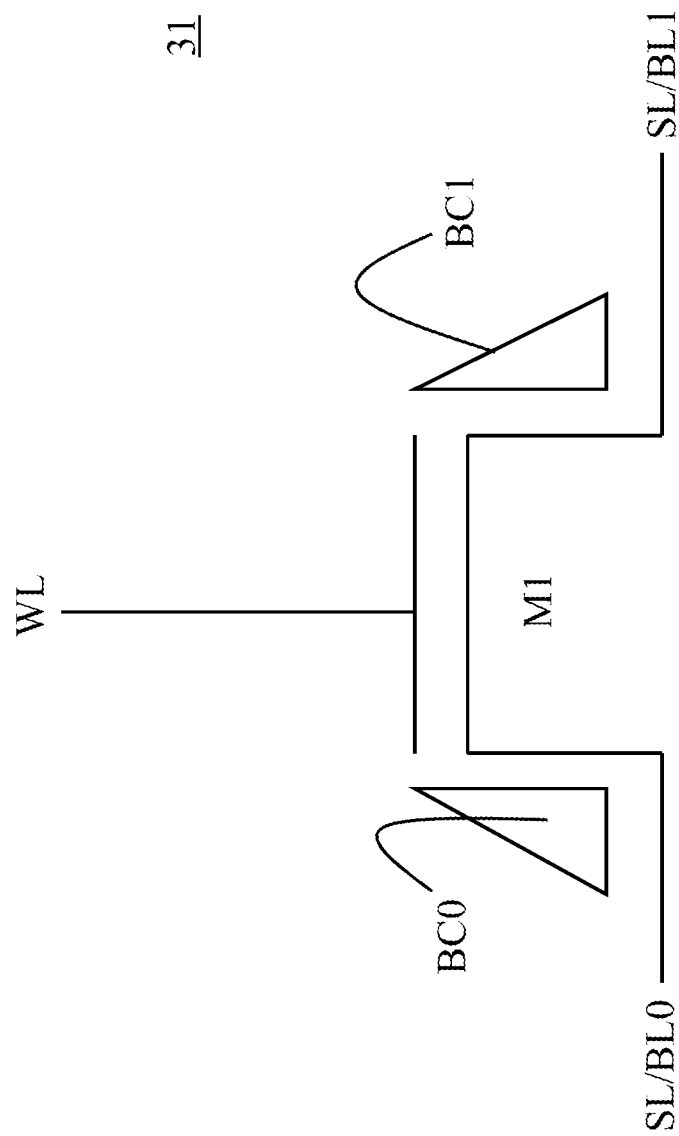
FIG. 3 illustrates a circuit schematic of an embodiment storage cell.

FIG. 3 depicts in a schematic view a sidewall storage cell 31 having two bit cell storage areas BC0 and BC1 in the sidewall regions of transistor M1. This illustrates the schematic connections of the memory cells 11 in FIGS. 1 and 2 above. A word line WL is coupled to the gate terminal of the storage cell 31. A select or bit line labeled SL/BL0 is coupled to the source/drain terminal on the BC0 side of the transistor M1. A second select or bit line labeled SL/BL1 is coupled to the source/drain terminal of the transistor M1 on the BC1 side. By operating the SL/BL lines SL/BL0 and SL/BL1 in an appropriate manner, both sidewall storage cells BC0 and BC1 may be programmed, read, and erased. By placing appropriate voltages on the gate and the SL/BL lines, either sidewall storage BC0 or BC1 may be "read" by determining whether the bit cell BC0 or BC1 is programmed.

Read operations may be performed by placing a mid-level gate voltage on the word line WL, and an appropriate ground or low voltage on the respective "source" (the source/drain region selected depending on which bit cell is being read) and a nominal bit line voltage on the "drain" (the selected source/drain region that is not the "source" for a particular operation is the "drain"). If a current from drain to source Ids flows during the read operation, then the selected bit cell is not programmed (low Vt), and stores a logic "1", in one example. If, during the read operation, drain to source current does not flow, then the particular bit cell is programmed (high Vt), and stores a logic "0", for example. In these examples, the bit cell is said to be turned "off".

Figure 4:
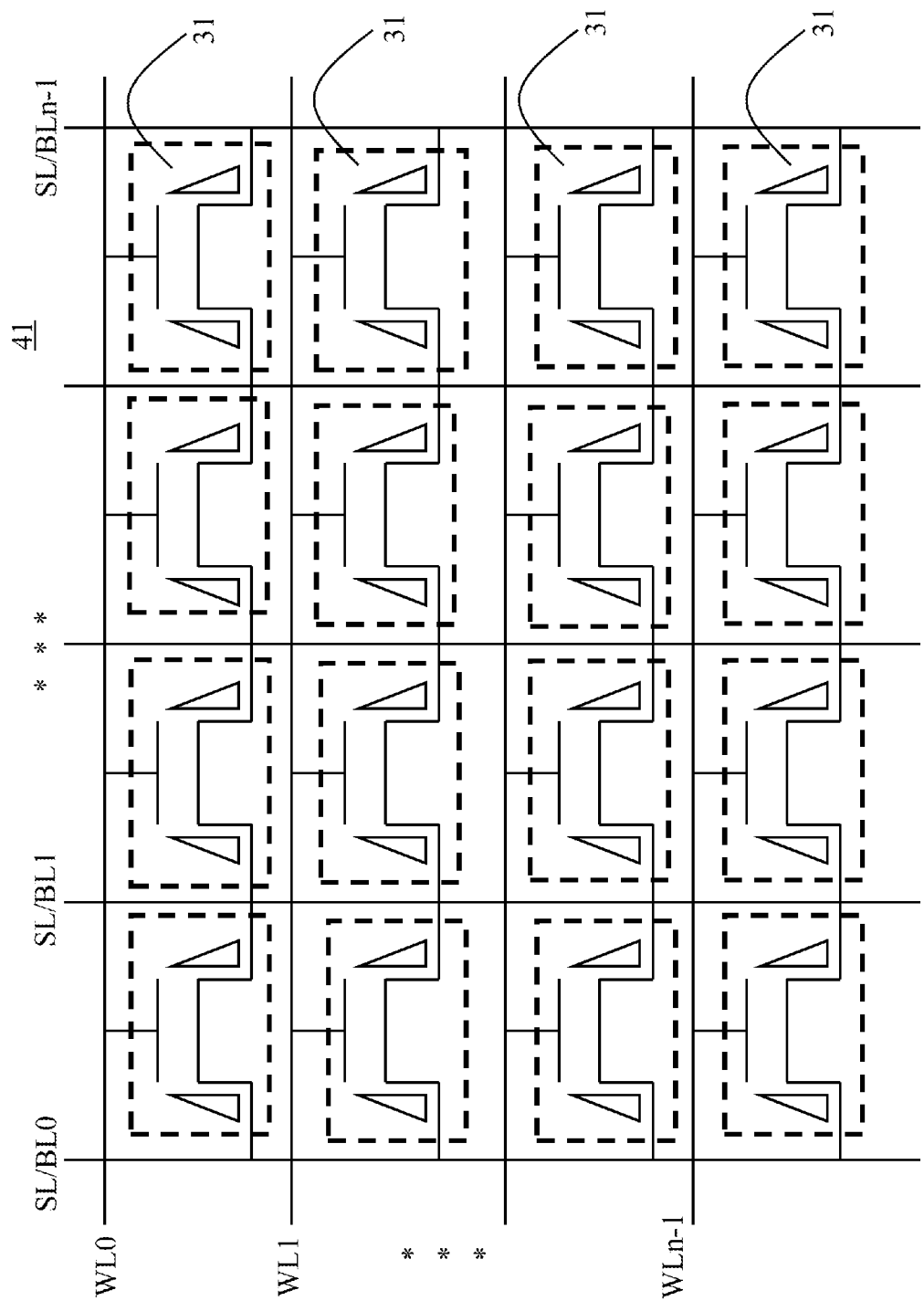
FIG. 4 illustrates in a circuit schematic an embodiment storage cell array.

FIG. 4 depicts in a layout view an array 41 of the memory cells 31 as described above, arranged in rows and columns. In this non-limiting example, each row has a number of cells "n" in columns from 0 to n−1, and similarly each column has a number of cells "n" in rows. Each memory cell 31 has two bit cells and can thus store two bits of data. In the embodiments, the memory cells will store a bit on one sidewall storage bit cell, and a different bit on the other sidewall storage bit cell, but the true and complementary data bits from one programming cycle will be stored in the sidewall storage bit cells of two different memory cells. Both of these complementary stored bits will be accessed from the sidewall storage cells when the data bit is read, as is described further below.

In the illustration of FIG. 4, the columns are arbitrarily labeled SL/BL0 . . . SL/BLn-1. The reason for the labeling shown is that in some operations, the column lines will receive the "select" voltage, for example a voltage SL for a source or drain terminal. In other operations the column lines will receive a data voltage, for example in a read, a nominal bit line voltage Vb for a line BL, or BL_. The bit lines are used to transfer data to and from the cells. Since the cells 31 each have two storage areas, one in each of the two sidewall regions, the bit lines and select lines may be functionally reversed to access first one, and then the other, of the two bit cells, one bit cell being in each of the sidewall storage regions of each of the memory cells 31.

Figure 5:
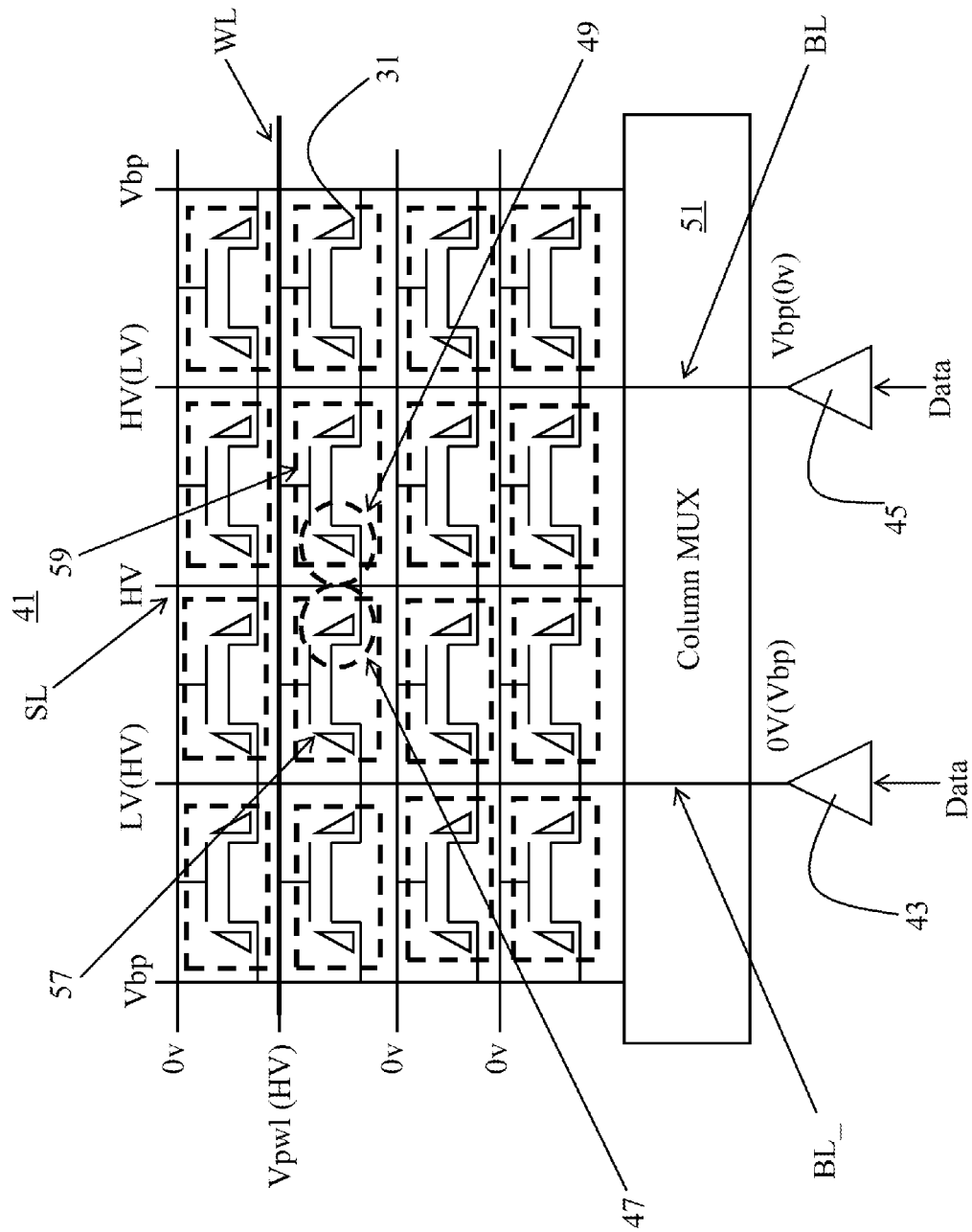
FIG. 5 illustrates in a circuit schematic a programming operation of an embodiment storage cell array.

FIG. 5 illustrates the array 41 of FIG. 4 in a programming operation, or a "write" cycle. Data that is to be written is provided as true and complementary data to input buffers 45 and 43, respectively. A column mux 51 decodes the column address for the bit cells to be used in the cycle, from column address bits (not shown) received in a decoder. In this example, bit cells 47 and 49 are selected to store the complementary data bits in one-half of the memory storage cells 57 and 59. A high voltage "HV" is placed on one column line that is common between the two storage cells 57, 59 for the programming operation. This column line is labeled "SL" in FIG. 5. The SL line is coupled to the "drain" for the programming of each of the memory cells 57 and 59. These memory cells also both are located on the same row and a high programming word line voltage labeled "Vpw1 (HV)" is placed on the word line that couples to the gates of both memory cells 57 and 59. In this manner two of the memory cells 57, 59 are selected for the operation.

Two bit cells will be written, one to logic "1" (unprogrammed) and one to logic "0" (programmed). Which one of the two bit cells 47, 49 is programmed to a logic "0" (a high Vt, for example) and which is programmed to a logic "1" (low Vt) depends on the particular data being written. In this example, input data labeled "Data" is coupled through a buffer 45 to the selected column line labeled "BL" and on to bit cell 49 in the storage cell 59. If the data is a logic "1", then the data buffer 45 outputs a logic high bit line voltage "Vbp" on the bit line BL, and the respective column line receives a high voltage "HV". In that case, there is a high voltage HV on both the "source" and the "drain" of the transistor in storage cell 59, and no potential difference exists, so no current flows in the channel. No programming occurs in this case. Bit cell 49 thus stores a logic "1", corresponding to the logic value of the Data bit, "1".

In contrast, in the same example, data buffer 43 receives the logic value Data_, which corresponds to logic "0" in this example, and outputs a low voltage, for example 0V, signal. The respective column line labeled "BL_" is coupled to the storage cell 57, which then receives a low voltage "LV". This column line is coupled to the source of the storage cell 57. Thus the transistor in the storage cell 57 has a low voltage at the "source", a high voltage HV on the gate, and a high voltage HV on the "drain", therefore channel hot electrons flow from the source to the drain, and programming occurs to bit cell 47. Bit cell 47 is programmed and the bit cell 47 stores a logic "0".

In FIG. 5, the opposite data write example is also shown using the voltages in shown in parentheses, illustrating a programming cycle where the Data is a logic "0", and Data_is a logic '1". In this case, the bit cell 49 would be programmed, and bit cell 47 would be left unprogrammed, by the write operation.

Note that the particular column line connections shown in FIG. 5 could be modified and these modifications may form additional alternative embodiments. For example, the use of a single "select" line is one approach for operating the array 41, but in other approaches, a different scheme could use multiple "select" lines for a programming cycle. In this manner storage cells with bit cells that are not physically adjacent could be used to store the two bits. For example, cells in different sub-arrays could be used, instead of cells that are adjacent and in the same physical area. The use of the embodiments includes storing a true and a complementary bit in bit cell storage areas of two different memory cells, each cell capable of storing two bits in two bit cell storage areas. The examples described herein are illustrative of ways that may be used arrange and connect to the storage cells, but these illustrative examples are not to be read to limit the embodiments or the scope of the appended claims.

During the programming operation shown in FIG. 5, it is noted that the "select" function is performed by the column line that is shared between memory cells 57 and 59. These cells are arranged adjacent to one another in the same row, so that when the program word line voltage "Vpw1" is placed at a high voltage on the gate terminals of the two memory cells 57, and 59, the row of cells is selected, the remaining rows have word lines at "0" volts and are not selected. The high voltage HV on the common column line then "selects" the memory cells 57 and 59 for programming. The other columns are placed at a nominal voltage (Vbp) and so the source and drain regions for those devices are such that those bit cells are not affected. The voltages on the active column lines for programming memory cells 57 and 59 corresponds to the logical state of the Data, Data_inputs as described above, and these column lines act as "bit" and "bit_" lines for this operation.

Figure 6:
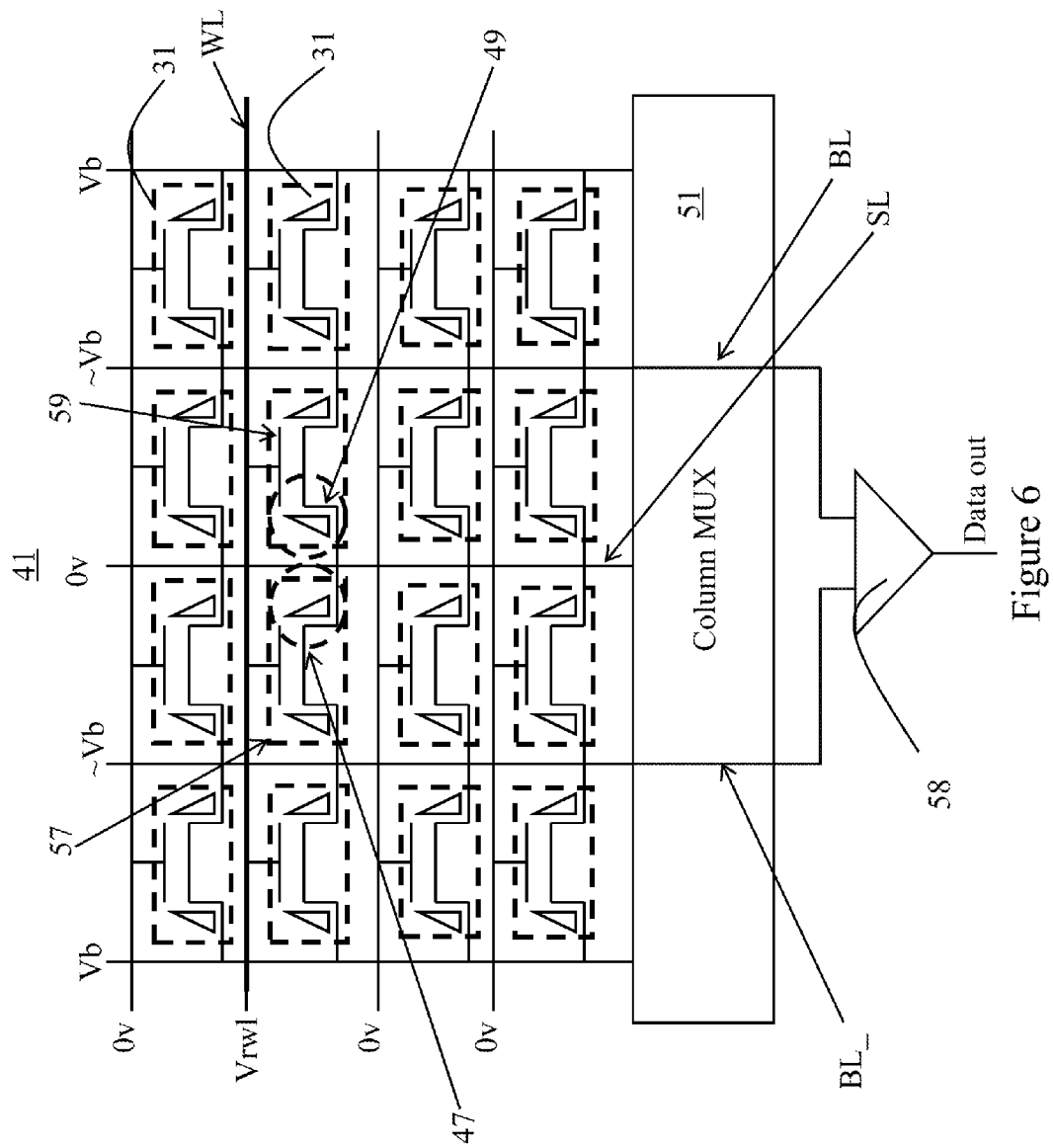
FIG. 6 illustrates in a circuit schematic a read operation of an embodiment storage cell array.

FIG. 6 illustrates the read cycle for the bit cells described above with respect to FIG. 5. In FIG. 6, array 41 has a plurality of memory storage cells 31 as described above, each storage cell having two bit cells for storage on sidewalls of a SONOS cell. As shown in FIG. 5, the bit cells 47 and 49 were programmed with a bit, and a complementary bit, that correspond to the logical values of the data received for writing.

In FIG. 6, the memory cells 57, 59 which include the bit cells 47, 49 are selected by a select line voltage of 0V being placed on the common "source" line in the column between the two memory cells 57 and 59, labeled "SL". This column line SL is selected from the columns in the array 41 by the column mux 51 in response to decoding a column address field (not shown). A read word line voltage labeled "Vrw1" is placed on the common word line coupled to the row of cells that includes the memory cells 57 and 59. This read voltage Vrw1 may be selected from a range of voltages depending on the semiconductor process used but will be selected to be greater than the "low Vt" voltage and less than the "high Vt" voltage. The read word line voltage is selected so that a storage cell having a bit cell storing logic "1" (unprogrammed) will turn on, while a storage cell having a bit cell storing logic "0" (programmed) will not turn on. A voltage from about 1-5 volts may be used depending on the process node and the logic level voltages in use in the device.

When the word line places the read voltage Vrw1 on the gates of the storage cells in the row including storage cells 57 and 59, the "drain" nodes for the memory cells 57 and 59, which are coupled to the column lines labeled BL and BL_, will also be placed at a nominal bit line voltage Vb, which may also be a logic high voltage of between 1-5 V. This voltage may be affected slightly when the unprogrammed bit cell (which is 47, or 49, depending on the stored data value) that stores a logic "1" turns on in response to the read voltage Vrw1. This is indicated by the "~" symbols next to the voltage Vb as shown in the figure. A current will flow into the transistor of the unprogrammed bit cell (Ids current) and the voltage Vb on the corresponding bit line BL or BL_ may therefore change slightly. More importantly, this current will only flow in one of the two memory cells 57, 59. By comparing the bit line currents at comparator 58, a data out value of "0" or "1" may be easily determined. The use of two complementary data bits on the pair of bit lines B1, BL_ provides a "self-referencing" data, so no reference voltage or reference current is needed. The comparison is therefore reliably implemented in simple circuitry. Data output buffer 58 drives the data out following the read operation.

Figure 7:
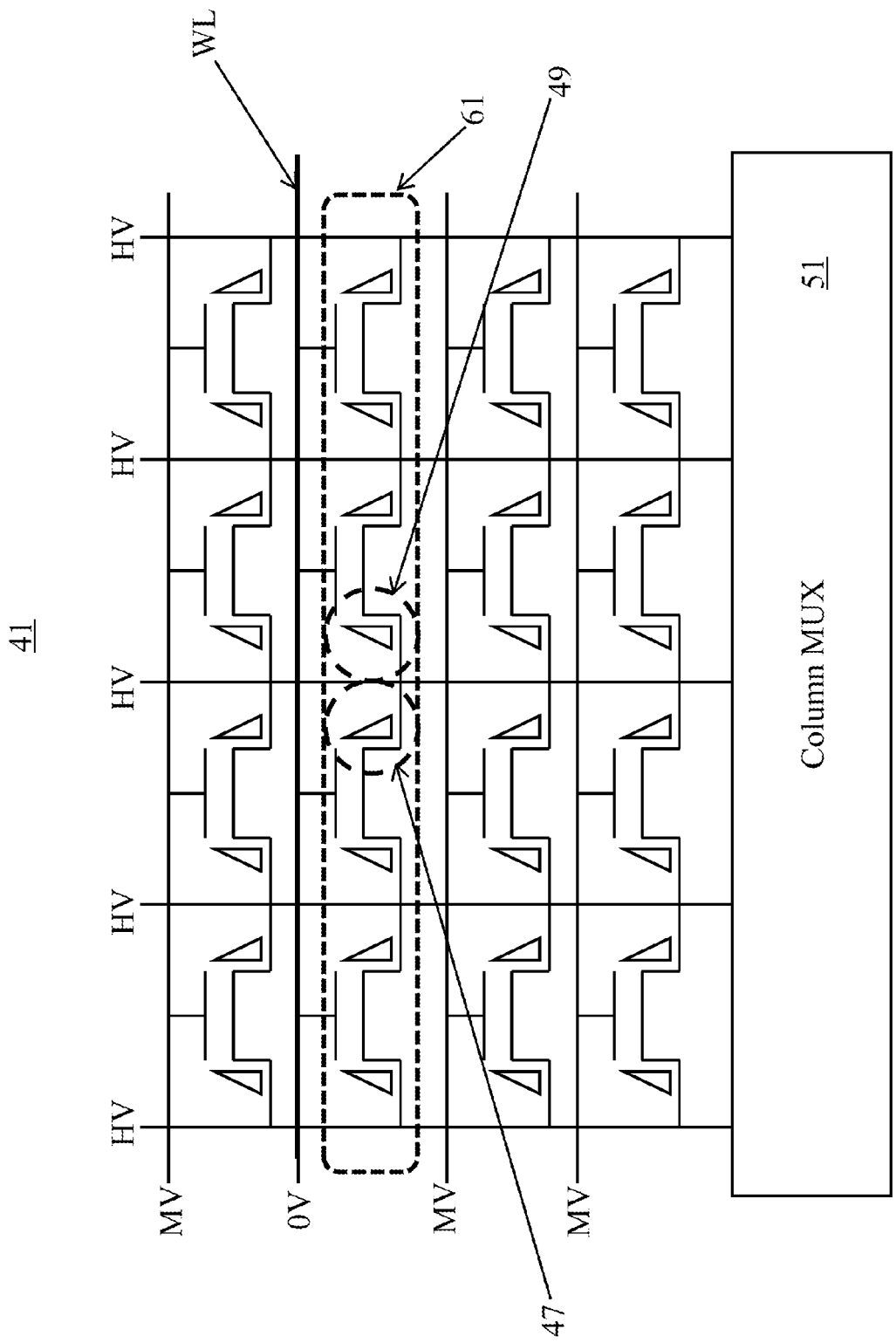
FIG. 7 illustrates in a circuit schematic an erase operation of an embodiment storage cell array.

FIG. 7 illustrates in one embodiment an erase operation for bit cells in the array 41. Again array 41 has a plurality of memory cells 31 arranged in rows and columns as shown above in FIGS. 4, 5, and 6. In the erase operation, a band to band hot hole (BTBHH) injection approach is used. A high voltage HV is placed on the column lines. A selected word line for erasure, here labeled WL, receives a low voltage, such as 0V, on the word line. The cells along this selected row are labeled 61. Hot holes will be attracted to the high voltage in the drain regions and will form electron-hole pairs in the sidewall regions, erasing the stored charge and restoring the bit cells 47, 49 to an erased state.

Figure 8:
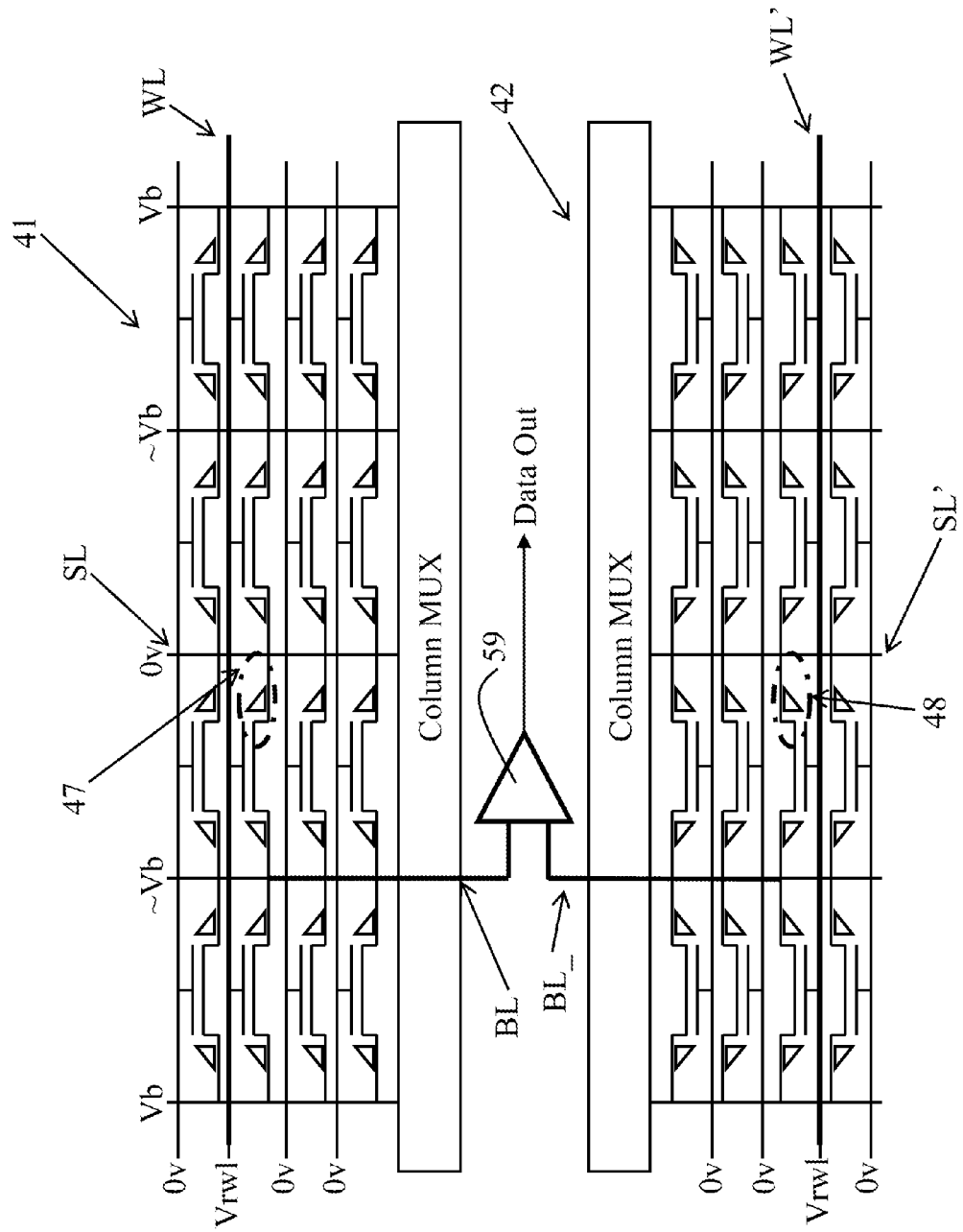
FIG. 8 illustrates in a circuit schematic an alternative arrangement for an embodiment storage cell array.

FIG. 8 illustrates an alternative embodiment using cells in multiple arrays to store the true and complementary data bits. In FIG. 8, array 41 may be provided as described above. This array may store true data bits in a plurality of bit cells in the storage cells, as described above, each storage cell having two bit cells in sidewall storage areas. Array 42 is a symmetrical array that is formed in the same manner as array 41 and stores complementary data bits in a plurality of bit cells in storage cells, each storage cell having two bit cells in sidewall storage areas. In FIG. 8, a read operation is shown. A read voltage Vrw1 is placed on word lines WL and WL' in each of the arrays 41 and 42. A column select line SL and SL' is placed at a low voltage such as "0" volts for a column in each array, so that the memory cell at the intersection of the row lines WL and WL' and the select line SL and SL', respectively, is selected in each array 41 and 42. A bit cell 47 is read containing the true data which is output on the column line labeled BL, and the complementary bit cell 48 is read and the complementary data is output on the column line BL_. The currents from the two cells are compared to determine the data value for the output, Data Out. As described above, only one of the two complementary storage cells selected will have drain current flowing, based on the stored data in the bit cells, which corresponds to a logic "0" or a logic "1".

Other arrangements are possible. The word lines may be segmented into sub array portions, and the columns may be arranged in different formats, which form alternative embodiments. Folded and diagonal column and row lines are alternatives. The embodiments store true and complementary data bits in ½ of a pair of storage cells, so that to store a data bit, a "1 T" storage density is achieved by using one of the two bit cells available in each storage cell. Both bit cells are programmed, and both bit cells are read to provide very robust performance.

Figure 9:
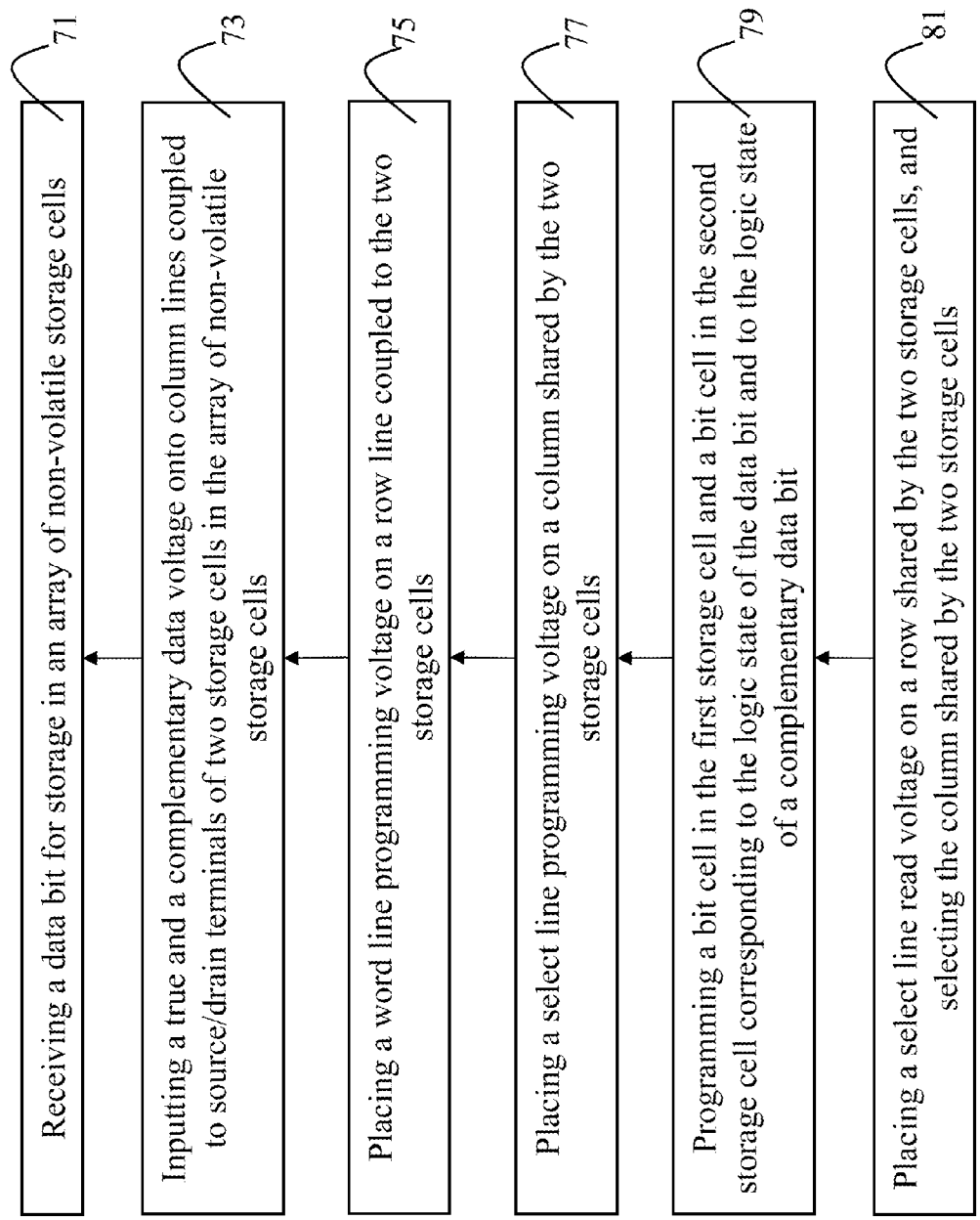
FIG. 9 illustrates in a flow diagram a method embodiment.

FIG. 9 depicts in a flow diagram a method embodiment. In FIG. 9, a data bit is received for storage in a non-volatile storage array at step 71. At step 73, a true and a complementary form of the data bit are input onto column lines acting as bit lines, each bit line coupled to a source/drain terminal of a column of cells. In step 75, a row of cells is selected by placing a row line program voltage on the word line coupled to a row of cells. Two storage cells each at an intersection of the active row line, and the column lines, are selected. At step 77, a select line voltage is placed on a column line that is coupled to the opposite source/drain terminal of selected storage cells. In this manner a pair of bit cells, each bit cell one of two bit cells within a pair of storage cells is selected. In step 79, one of the bit cells is programmed, depending on the data logic state, and the other bit cell is left unprogrammed.

At step 81, a read is performed by selecting both of the bit cells within the two storage cells and placing a read word line voltage on the row line coupled to each storage cell. A select voltage is placed on one column line coupled to each of the two storage cells, and a bit line and a complementary bit line are coupled to another column coupled to each of the two storage cells. True and complementary data is output on the bit lines, and compared. The comparison outputs a data value corresponding to the stored data.

Figure 10:
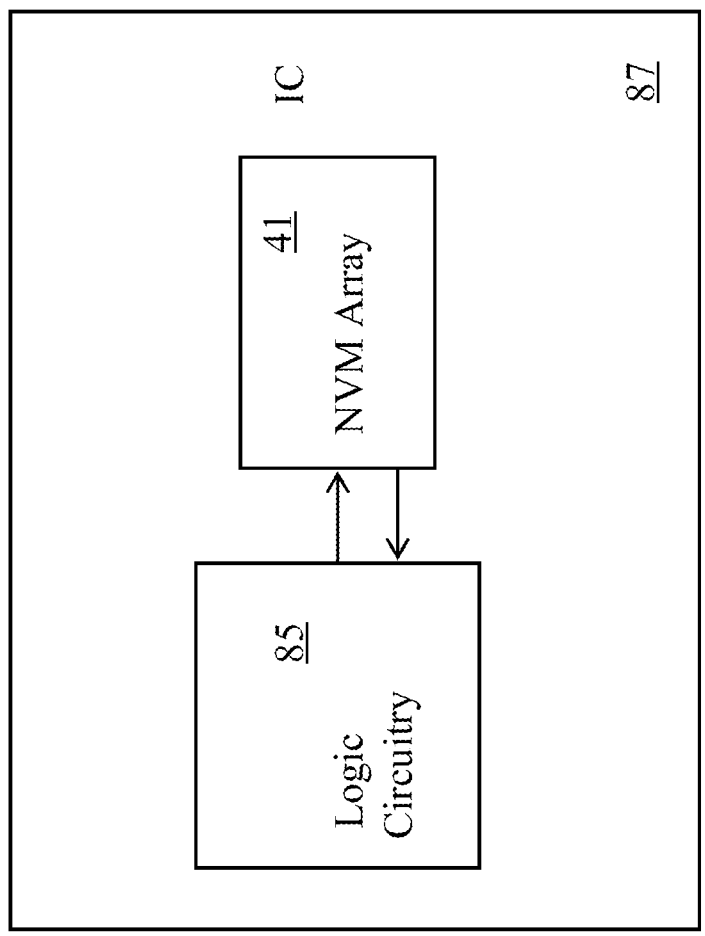
FIG. 10 illustrates in a plan view an embodiment integrated circuit.

FIG. 10 depicts in a block diagram view an integrated circuit 87 that includes a logic circuitry portion 85 and a non-volatile memory array 41 such as are shown above coupled to form a circuit. The logic circuitry 85 may be, for example, a microprocessor, a RISC core such as an ARM core, a functional circuit such as a digital signal processor (DSP), an analog-to-digital converter, or the like. In one example, the integrated circuit 87 may include a processor or microprocessor coupled to non-volatile storage; for example for data or program storage. Because the embodiments of storage cells may be formed in a logic semiconductor process without any additional steps or added masks, the non-volatile array 41 may be embedded with logic circuitry 85 to provide highly integrated circuits in advanced logic processes.

In an embodiment, an apparatus includes an array of non-volatile storage cells formed in a portion of a semiconductor substrate, including a first storage cell having a first bit cell and a second bit cell each for storing trapped charge corresponding to a data bit; a second storage cell having a third bit cell and a fourth bit cell each for storing trapped charge corresponding to a data bit; a word line coupled to supply voltages to gate terminals of the first and second storage cells; and a column multiplexer coupled to a plurality of column lines, selected ones of the column lines coupled to a first source/drain terminal of the first and the second storage cell and coupled to a second source/drain terminal of the first and second storage cell, the column multiplexer coupled to receive data and complementary data for storage in the non-volatile storage cells, the column multiplexer coupling a voltage to one of the column lines connected to the first storage cell corresponding to the data, and coupling a voltage to one of the column lines connected to the second storage cell corresponding to the complementary data.

In a further embodiment, in the above apparatus the first and second storage cells each comprise a MOS transistor. In yet another embodiment, in the above apparatus, the first, second, third and fourth bit cells comprise sidewall storage cells of the MOS transistors. In still another embodiment, the first and second bit cells of the above apparatus comprise sidewall storage regions of a first MOS transistor, and the third and fourth bit cells comprise sidewall storage regions of a second MOS transistor. In still another embodiment, the sidewall storage cells comprise a nitride layer. In still a further embodiment, the sidewall storage cells comprise an oxide-nitride-oxide layer.

In further embodiments of the above apparatus, the column multiplexer supplies a select line voltage to a column line shared by the first and second storage cells. In yet another embodiment, the array of storage cells comprises a plurality of storage cells arranged in rows and columns and coupled to word lines along the rows and the column lines along the columns. In still a further embodiment, the semiconductor substrate further comprises logic circuitry. In another alternative embodiment, in the above embodiment, the logic circuitry is coupled to the array of storage cells.

In a method embodiment, the method includes forming an array of non-volatile storage cells on a semiconductor substrate, the array of non-volatile storage cells arranged in rows along word lines and in columns along column lines, each non-volatile storage cell having a gate terminal coupled to one of the word lines, a first source/drain terminal coupled to one of the column lines, and a second source/drain terminal coupled to another one of the column lines, and each of the non-volatile storage cells having a first and a second sidewall storage region forming first and second bit cells for storing a bit; providing a column multiplexer coupled to the column lines, the column multiplexer providing a first voltage on a selected one of the column lines corresponding to a logic state of a data input, providing a second voltage on another selected one of the column lines corresponding to a logic state of a complementary data input, and providing a programming select voltage on a third one of the column lines, at least a first and a second non-volatile storage cell each coupled to the programming select voltage at the first source/drain terminal, the first storage cell receiving the first voltage at the second source/drain terminal of the first storage cell and the second storage cell receiving the second voltage at the second source/drain terminal of the second storage cell; and providing a programming voltage on the word line of a selected row coupled to the first and second non-volatile storage cells; wherein the first storage cell receives the programming voltage on the word line and stores a charge corresponding to the logic state of the data in a first bit cell, and the second storage cell receives the programming voltage on the word line and stores a charge corresponding to the logic state of the complementary data in a second bit cell.

In yet another embodiment, in the method above storing a charge comprises storing a charge by channel hot electron programming. In still a further embodiment, in the method above forming the array of non-volatile storage cells further comprises forming MOS transistors each having sidewall storage regions on the semiconductor substrate. In still a further embodiment, in the method above forming the MOS transistors further comprises forming nitride charge trapping regions in the sidewalls of the MOS transistors. In still another embodiment, in the methods above forming the MOS transistors further comprises forming oxide-nitride-oxide charge trapping regions in the sidewalls of the MOS transistors. In still another embodiment, The method above includes supplying a low voltage on the word line of the selected row, and supplying a high voltage on each of the column lines coupled to the first and second storage cells, wherein the bit cells of the first and second storage cells are erased by hot hole injection.

In another embodiment, a method includes forming an array of non-volatile storage cells on a semiconductor substrate arranged in rows along word lines and in columns along column lines, the non-volatile storage cells each having a gate terminal coupled to one of the word lines, a first source/drain terminal coupled to one of the column lines, and a second source/drain terminal coupled to another one of the column lines, each of the non-volatile storage cells having a first and a second sidewall storage region forming first and second bit cells for storing a bit; providing a read voltage on the word line of a selected row of the storage cells including a first storage cell and a second storage cell, and providing a select voltage on one or more column lines coupled to both the first and second storage cells; and providing a column multiplexer coupled to the column lines, the column multiplexer receiving a first current on a selected one of the column lines corresponding to a logic state of a stored first bit stored in the first storage cell, the column multiplexer receiving a second current on another selected one of the column lines corresponding to a logic state of a complementary stored bit stored in the second storage cell. In still a further embodiment, the method includes providing a comparator coupled to receive the first and second currents on the respective column lines and outputting a data bit corresponding to a stored data bit. In yet another embodiment, the method further includes providing MOS transistors on the semiconductor substrate each having sidewall storage regions. In another method embodiment, providing the sidewall storage regions includes nitride charge trapping regions in the sidewall storage regions forming the bit cells.

Although exemplary embodiments of the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. An apparatus, comprising:
    an array of non-volatile storage cells formed in a portion of a semiconductor substrate, comprising:
        a first storage cell having a first bit cell for storing trapped charges corresponding to a first data bit and a second bit cell for storing trapped charge corresponding to a second data bit, the first data bit and the second data bit being representative of different data bits;
        a second storage cell having a third bit cell for storing trapped charges corresponding to a third data bit and a fourth bit cell for storing trapped charge corresponding to a fourth data bit, the third data bit and the fourth data bit being representative of different data bits, the third data bit being a complementary data bit to the first data bit, the first and second storage cells comprising a first MOS transistor and a second MOS transistor, respectively, the first and second bit cells comprising first sidewall storage cells adjoining sidewalls of a first gate of the first MOS transistor, the third and fourth bit cells comprising second sidewall storage cells adjoining sidewalls of a second gate of the second MOS transistor, the first sidewall storage cells comprising first oxide-nitride-oxide layers adjoining sidewalls of the first gate, at least an oxide portion of the first oxide-nitride-oxide layers being a single continuous layer extending across a top surface from one sidewall to an opposite sidewall of the first gate of the first MOS transistor, the second sidewall storage cells comprising second oxide-nitride-oxide layers adjoining sidewalls of the second gate, at least an oxide portion of the second oxide-nitride-oxide layers being a single continuous layer extending across a top surface from one sidewall to an opposite sidewall of the second gate of the second MOS transistor;

a word line coupled to supply voltages to gate terminals of the first and second storage cells; and a column multiplexer coupled to a plurality of column lines, a first column line coupled to a first source/drain terminal of the first storage cell and a second column line coupled to a first source/drain terminal of the second storage cell, the column multiplexer coupled to receive data and complementary data for storage in the non-volatile storage cells, the column multiplexer coupling a voltage to the first column line corresponding to the data, and coupling a voltage to the second column line corresponding to the complementary data.

2. The apparatus of claim 1, wherein the column multiplexer supplies a select line voltage to a third column line shared by the first and second storage cells.

3. The apparatus of claim 1 wherein the array of non-volatile storage cells comprises a plurality of non-volatile storage cells arranged in rows and columns and coupled to word lines along the rows and the column lines along the columns.

4. The apparatus of claim 1, wherein the semiconductor substrate further comprises logic circuitry.

5. The apparatus of claim 4 wherein the logic circuitry is coupled to the array of non-volatile storage cells.

6. A method, comprising:

forming an array of non-volatile storage cells on a semiconductor substrate, the array of non-volatile storage cells arranged in rows along word lines and in columns along column lines, each non-volatile storage cell having a gate terminal coupled to one of the word lines, a first source/drain terminal coupled to one of the column lines, and a second source/drain terminal coupled to another one of the column lines, and each of the non-volatile storage cells having first and second sidewall storage regions forming first and second bit cells for storing a bit, the forming the array of non-volatile storage cells further comprising forming MOS transistors each having gate electrodes with sidewall storage regions on the semiconductor substrate, the forming the MOS transistors further comprising forming oxide-nitride-oxide regions in sidewalls of the MOS transistors, at least one of the oxide-nitride-oxide regions comprising silicon oxide disposed on top surfaces of the gate electrodes of the MOS transistors;

providing a column multiplexer coupled to the column lines, the column multiplexer providing a first voltage on a selected one of the column lines corresponding to a logic state of a data input, providing a second voltage on another selected one of the column lines corresponding to a logic state of a complementary data input, and providing a programming select voltage on a third one of the column lines, at least first and second non-volatile storage cells each coupled to the programming select voltage at the first source/drain terminals, the first non-volatile storage cell receiving the first voltage at the second source/drain terminal of the first non-volatile storage cell and the second non-volatile storage cell receiving the second voltage at the second source/drain terminal of the second non-volatile storage cell; and providing a programming voltage on the word line of a selected row coupled to the first and second non-volatile storage cells;

wherein the first non-volatile storage cell receives the programming voltage on the word line and stores a charge corresponding to the logic state of the data in a first bit cell, and the second non-volatile storage cell receives the programming voltage on the word line and stores a charge corresponding to the logic state of the complementary data in a second bit cell.

7. The method of claim 6, wherein storing a charge comprises storing a charge by channel hot electron programming.

8. The method of claim 6, and further comprising:

supplying a low voltage on the word line of the selected row, and supplying a high voltage on each of the column lines coupled to the first and second non-volatile storage cells, wherein the bit cells of the first and second non-volatile storage cells are erased by hot hole injection.

9. A structure comprising:

an array of non-volatile storage cells formed in a semiconductor substrate, the array comprising:

a first storage cell comprising a first transistor having a first gate electrode, the first storage cell comprising a first sidewall storage cell for storing charges corresponding to a first data bit and a second sidewall storage cell for storing charges corresponding to a second data bit, the first data bit and the second data bit being representative of different data bits, the first and second sidewall storage cells comprising a first set of dielectric layers adjoining sidewalls of the first gate electrode, at least one of the first set of dielectric layers being a continuous layer extending across a top surface from one sidewall to an opposite sidewall of the first gate electrode of the first transistor, the at least one of the first set of dielectric layers having a first lateral extent and a second lateral extent, the second lateral extent opposing the first lateral extent, the first and second lateral extents disposed above the first gate electrode, the first lateral extent defining an adjacent third lateral extent of a first adjacent dielectric feature, the second lateral extent defining an adjacent fourth lateral extent of a second adjacent dielectric feature, the first and second adjacent dielectric features comprising a first adjacent dielectric layer of the first set of dielectric layers, the first adjacent dielectric layer of the first set of dielectric layers adjacent the at least one of the first set of dielectric layers; and a second storage cell comprising a second transistor having a second gate electrode, the second storage cell comprising a third sidewall storage cell for storing charges corresponding to a third data bit and a fourth sidewall storage cell for storing charges corresponding to a fourth data bit, the third data bit and the fourth data bit being representative of different data bits, the third data bit being a complementary data bit to the first data bit, the third and fourth sidewall storage cells comprising a second set of dielectric layers adjoining sidewalls of the second gate electrode, at least one of the second set of dielectric layers being a continuous layer extending across a top surface from one sidewall to an opposite sidewall of the second gate electrode of the second transistor, the at least one of the second set of dielectric layers having a fifth lateral extent and a sixth lateral extent, the sixth lateral extent opposing the fifth lateral extent, the fifth and sixth lateral extents disposed above the first gate electrode, the fifth lateral extent defining an adjacent seventh lateral extent of a third adjacent dielectric feature, the sixth lateral extent defining an adjacent eighth lateral extent of a fourth adjacent dielectric feature, the third and fourth adjacent dielectric features comprising a second adjacent dielectric layer of the second set of dielectric layers, the second adjacent dielectric layer of the second set of dielectric layers adjacent the at least one of the second set of dielectric layers.

10. The structure of claim 9, wherein the array further comprises:
a word line coupled to the first and second gate electrodes of the first and second storage cells, respectively.

11. The structure of claim 10, wherein the array further comprises:
a column multiplexer coupled to a plurality of column lines, a first column line coupled to a first source/drain terminal of the first storage cell and a second column line coupled to a first source/drain terminal of the second storage cell, the column multiplexer coupled to receive data and complementary data for storage in the non-volatile storage cells, the column multiplexer coupling a voltage to the first column line corresponding to the data, and coupling a voltage to the second column line corresponding to the complementary data.

12. The structure of claim 11, wherein the column multiplexer supplies a select line voltage to a third column line shared by the first and second storage cells.

13. The structure claim 9, wherein the array of non-volatile storage cells comprises a plurality of non-volatile storage cells arranged in rows and columns and coupled to word lines along the rows and column lines along the columns.

14. The structure of claim 9, wherein the semiconductor substrate further comprises logic circuitry.

15. The structure of claim 14, wherein the logic circuitry is coupled to the array of non-volatile storage cells.

16. The structure of claim 9, wherein the first set of dielectric layers further comprises:
a first dielectric layer over the sidewalls and top surface of the first gate electrode;
a second dielectric layer on the first dielectric layer; and
a third dielectric layer on the second dielectric layer.

17. The structure of claim 16, wherein the first dielectric layer is the only one of the first set of dielectric layers that extends across the top surface of the first gate electrode.

18. The structure of claim 16, wherein the first dielectric layer is an oxide layer, the second dielectric layer is a nitride layer, and the third dielectric layer is an oxide layer.

19. The structure of claim 16, wherein the first dielectric layer comprises $SiO_2$, the second dielectric layer comprises SiN, and the third dielectric layer comprises $SiO_2$.

20. The structure of claim 9, wherein the first and second transistors are metal-oxide-semiconductor (MOS) transistors.

* * * * *